United States Patent
Hong et al.

(10) Patent No.: US 9,136,120 B2
(45) Date of Patent: Sep. 15, 2015

(54) COMPOSITIONS FOR ETCHING AND METHODS OF FORMING A SEMICONDUCTOR DEVICE USING THE SAME

(71) Applicants: Samsung Electronics Co., Ltd., Suwon-si, Gyeonggi-do (KR); Soulbrain Co., Ltd., Seongnam-si (KR)

(72) Inventors: Young Taek Hong, Hwaseong-si (KR); Jinuk Lee, Daejeon (KR); Junghun Lim, Daejeon (KR); Jaewan Park, Daegu (KR); Chanjin Jeong, Gongju-si (KR); Hoon Han, Hwaseong-si (KR); Seonghwan Park, Cheongju-si (KR); Yanghwa Lee, Daejeon (KR); Sang Won Bae, Hwaseong-si (KR); Daehong Eom, Hwaseong-si (KR); Byoungmoon Yoon, Hwaseong-si (KR); Jihoon Jeong, Hwaseong-si (KR); Kyunghyun Kim, Hwaseong-si (KR); Kyounghwan Kim, Hwaseong-si (KR); ChangSup Mun, Hwaseong-si (KR); Se-Ho Cha, Hwaseong-si (KR); Yongsun Ko, Hwaseong-si (KR)

(73) Assignees: Samsung Electronics Co., Ltd. (KR); Soulbrain Co., Ltd. (KR)

( * ) Notice: Subject to any disclaimer, the term of this patent is extended or adjusted under 35 U.S.C. 154(b) by 0 days.

(21) Appl. No.: 14/573,845

(22) Filed: Dec. 17, 2014

(65) Prior Publication Data

US 2015/0104932 A1    Apr. 16, 2015

Related U.S. Application Data

(62) Division of application No. 13/601,064, filed on Aug. 31, 2012, now Pat. No. 8,940,182.

(30) Foreign Application Priority Data

Oct. 18, 2011    (KR) .......................... 10-2011-0106461

(51) Int. Cl.
*H01L 21/302*    (2006.01)
*H01L 21/02*    (2006.01)
(Continued)

(52) U.S. Cl.
CPC .......... *H01L 21/02658* (2013.01); *C09K 13/04* (2013.01); *C09K 13/06* (2013.01);
(Continued)

(58) Field of Classification Search
CPC .................. H01L 21/67075; H01L 21/31111; C09K 13/06; C09K 13/04
USPC ................ 438/745, 756, 757; 252/79.2, 79.4
See application file for complete search history.

(56) References Cited

U.S. PATENT DOCUMENTS

| | | | |
|---|---|---|---|
| 2004/0029353 A1* | 2/2004 | Zheng et al. | 438/424 |
| 2007/0111433 A1* | 5/2007 | Hirasawa et al. | 438/253 |

(Continued)

FOREIGN PATENT DOCUMENTS

| | | |
|---|---|---|
| JP | 2000-058500 | 2/2000 |
| JP | 2008-047796 | 2/2008 |
| KR | 1020110037741 A | 4/2011 |

*Primary Examiner* — Binh X Tran
(74) *Attorney, Agent, or Firm* — Myers Bigel Sibley & Sajovec, P.A.

(57) ABSTRACT

Etching compositions are provided. The etching composition includes a phosphoric acid, ammonium ions and a silicon compound. The silicon compound includes a silicon atom, an atomic group having an amino group combined with the silicon atom, and at least two oxygen atoms combined with the silicon atom. Methods utilizing the etching compositions are also provided.

8 Claims, 11 Drawing Sheets

(51) Int. Cl.
*C09K 13/04* (2006.01)
*C23F 1/16* (2006.01)
*C09K 13/06* (2006.01)
*H01L 21/311* (2006.01)
*H01L 29/66* (2006.01)
*H01L 29/788* (2006.01)
*H01L 29/792* (2006.01)
*H01L 27/115* (2006.01)

(52) U.S. Cl.
CPC ........... *C23F 1/16* (2013.01); *H01L 21/31111* (2013.01); *H01L 27/11556* (2013.01); *H01L 27/11582* (2013.01); *H01L 29/66825* (2013.01); *H01L 29/66833* (2013.01); *H01L 29/7889* (2013.01); *H01L 29/7926* (2013.01)

(56) References Cited

U.S. PATENT DOCUMENTS

| | | | |
|---|---|---|---|
| 2008/0081212 A1 | 4/2008 | Inbe et al. | |
| 2008/0169528 A1* | 7/2008 | Kim et al. | 257/506 |
| 2011/0065271 A1* | 3/2011 | Iwasawa et al. | 438/589 |
| 2011/0073838 A1* | 3/2011 | Khan et al. | 257/13 |
| 2012/0276714 A1* | 11/2012 | Shih et al. | 438/435 |
| 2013/0196497 A1* | 8/2013 | Shimada et al. | 438/591 |

* cited by examiner

COMPOSITIONS FOR ETCHING AND METHODS OF FORMING A SEMICONDUCTOR DEVICE USING THE SAME

CROSS-REFERENCE TO RELATED APPLICATIONS

This application is a divisional of and claims priority to U.S. patent application Ser. No. 13/601,064, filed Aug. 31, 2012, now U.S. Pat. No. 8,940,182 B2, which claims priority under 35 U.S.C. §119 to Korean Patent Application No. 10-2011-0106461, filed on Oct. 18, 2011, the disclosures of which are hereby incorporated by reference in their entireties.

BACKGROUND

The present disclosure herein relates to etchants and methods of forming a semiconductor devices, and more particularly, to compositions for etching and methods of forming semiconductor devices using the same.

Semiconductor devices are becoming more highly integrated to meet the requirements of customers, e.g., in order to provide high performance and low cost. Further, high reliable semiconductor devices may be desired to provide high performance and low cost. As semiconductor devices become more highly integrated, the reliability and/or electrical characteristics of the semiconductor devices may be more influenced by damage and/or deformation of elements constituting the semiconductor devices. The elements constituting the semiconductor devices may be damaged and/or deformed during fabrication processes thereof.

In particular, when an etching process is performed to remove a specific material layer selectively using an etchant, it is desirable that the etchant should have a higher etch selectivity with respect to other material layers and/or the etching process generate less byproduct to reduce process defects.

SUMMARY

Example embodiments are directed to compositions for etching and methods of forming a semiconductor device using the same.

According to some embodiments, a composition for etching includes a phosphoric acid, ammonium ions and a silicon compound material. The silicon compound material includes a silicon atom, an atomic group having an amino group combined with the silicon atom, and at least two oxygen atoms combined with the silicon atom.

The atomic group may be an amino alkyl group or an amino alkoxy group. The atomic group may include 1 to 10 carbon atoms.

The silicon compound material may be expressed by the following chemical formula 1. In the chemical formula 1, "$R^1$" denotes an amino alkyl group or an amino alkoxy group.

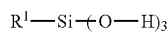

(Chemical Formula 1)

The silicon compound material may be expressed by the following chemical formula 2. In the chemical formula 2, "$R^2$", "$R^3$", "$R^4$" and "$R^5$" denote hydrogen, an alkyl group, an amino alkyl group and an amino alkoxy group, respectively. At least one of "$R^2$", "$R^3$", "$R^4$" and "$R^5$" may be an amino alkyl group or an amino alkoxy group, and "n" may be 2 or 3.

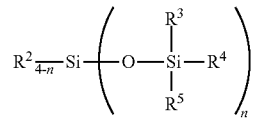

(Chemical Formula 2)

A content of the silicon compound material may be within the range of about 0.01 wt % to about 15 wt % in the composition.

A content of the ammonium ions may be within the range of about 0.01 wt % to about 10 wt % in the composition.

The composition may have an etch selectivity of a silicon nitride layer to a silicon oxide layer, and the etch selectivity may be greater than 100.

The atomic group having the amino group may stabilize a bonding structure of the silicon compound material.

According to some embodiments, an etchant includes phosphoric acid, ammonium ions or a compound including ammonium ions, and a silicon compound selected from the group consisting of amino propyl silanetriol, tri-(methyl, ethylamino-silane)methyl siloxane and tri-(di-ethylamino-silane)amino propyl siloxane. The etchant may include a phosphoric acid in an amount up to about 99.8 wt % of the etchant. The etchant may also include ammonium ions or a compound including ammonium ions in an amount in a range from about 0.01 wt % to about 10 wt % of the etchant. The etchant may further include a silicon compound in an amount in a range from about 0.01 wt % to about 15 wt % of the etchant.

According to further embodiments, a method of forming a semiconductor device includes alternately and repeatedly stacking nitride layers and oxide layers on a substrate to form a stack structure, forming an opening that penetrates the stack structure, forming a semiconductor pattern in the opening, and removing the nitride layers. The nitride layers are removed using an etching process, e.g., a wet etching process, that employs an etching composition including a phosphoric acid, a compound having ammonium ions, and a silicon compound material as an etchant. The silicon compound material includes a silicon atom, an atomic group having an amino group combined with the silicon atom, and at least two oxygen atoms combined with the silicon atom. The etching composition may include the silicon compound material having a content of about 0.01 wt % to about 15 wt % and the ammonium ions having a content of about 0.01 wt % to about 10 wt %.

The atomic group may be an amino alkoxy group including 1 to 10 carbon atoms or an amino alkyl group including 1 to 10 carbon atoms.

The silicon compound material may be expressed by the following chemical formula 1. In the chemical formula 1, "$R^1$" denotes an amino alkyl group or an amino alkoxy group.

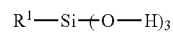

(Chemical Formula 1)

The silicon compound material may be expressed by the following chemical formula 2. In the chemical formula 2, "$R^2$", "$R^3$", "$R^4$" and "$R^5$" denote hydrogen, an alkyl group, an amino alkyl group and an amino alkoxy group, respectively. Further, at least one of "$R^2$", "$R^3$", "$R^4$" and "$R^5$" may be an amino alkyl group or an amino alkoxy Group, and "n" may be 2 or 3.

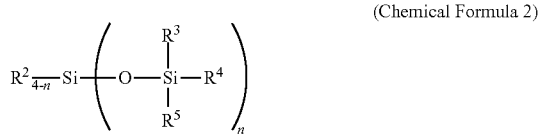

(Chemical Formula 2)

The oxygen atoms of the silicon compound material may combine with the oxide layers to protect the oxide layers during removal of the nitride layers.

BRIEF DESCRIPTION OF THE DRAWINGS

The above and other features and advantages of the disclosure will become more apparent in view of the attached drawings and accompanying detailed description.

DETAILED DESCRIPTION

Figure 1:
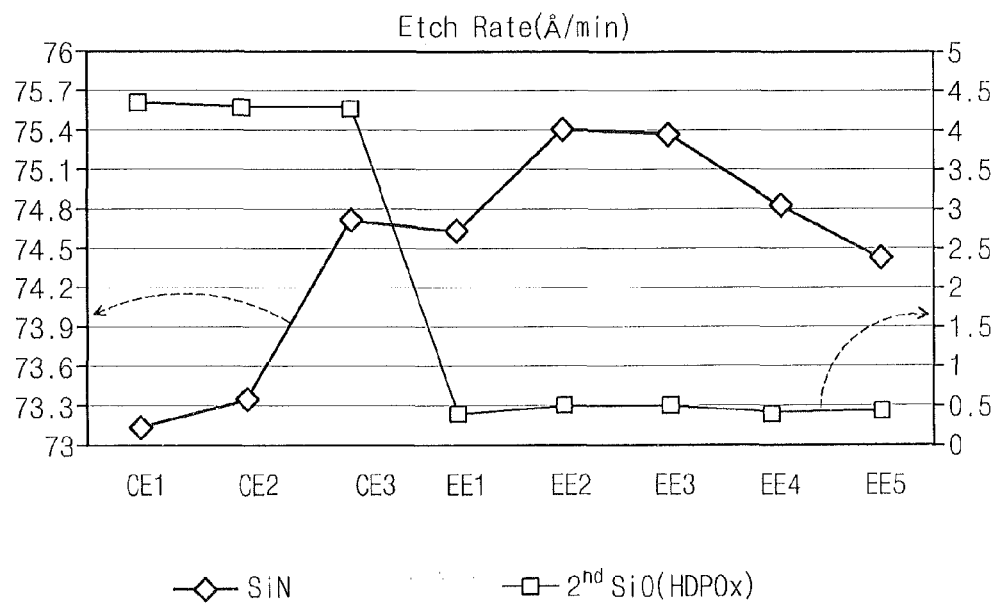
FIG. 1 is a graph illustrating etch rates of a silicon nitride layer and a silicon oxide layer when etching processes are performed using etchants according to exemplary embodiments and typical etchants according to comparative examples.

Exemplary embodiments are described below with reference to the accompanying drawings. Many different forms and embodiments are possible without deviating from the spirit and teachings of this disclosure and so the disclosure should not be construed as limited to the exemplary embodiments set forth herein. Rather, these exemplary embodiments are provided so that this disclosure will be thorough and complete, and will convey the scope of the disclosure to those skilled in the art.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element such as a layer, region or substrate is referred to as being "on" or "connected (or coupled) to" another element, it can be directly on or connected (or coupled) to the other element or intervening elements may be present. In contrast, the terms "directly on" "directly connected," or "directly coupled" mean that there are no intervening elements. Similarly, it will be understood that when an element such as a layer, region or substrate is referred to as being "between" two different elements, it can be directly interposed between the two different elements without any intervening element or intervening elements may be present therebetween. In contrast, the term "directly between" means that there are no intervening elements.

Exemplary embodiments of the inventive concepts are described herein with reference to perspective illustrations that are schematic illustrations of idealized embodiments (and intermediate structures) of exemplary embodiments. In the drawings, the sizes and relative sizes of layers and regions may be exaggerated for clarity. As such, variations from the shapes of the illustrations as a result, for example, of manufacturing techniques and/or tolerances, are to be expected. Thus, exemplary embodiments of the inventive concepts should not be construed as limited to the particular shapes of regions illustrated herein, but are to include deviations in shapes that result, for example, from manufacturing. For example, an etched region illustrated as a rectangle may have rounded or curved features having a predetermined curvature. Thus, the regions illustrated in the figures are schematic in nature and their shapes are not intended to illustrate the actual shape of a region of a device and are not intended to limit the scope of exemplary embodiments.

Moreover, it will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of the present inventive concept explained and illustrated herein include their complementary counterparts. The same reference numerals or the same reference designators denote the same elements throughout the specification.

Etching Compositions

An etching composition according to an exemplary embodiment may include phosphoric acid, silicon compound material and ammonium ions.

The phosphoric acid may react on a silicon nitride material to etch the silicon nitride material. This chemical reaction may be expressed by the following equation 1.

$$3Si_3N_4 + 27H_2O + 4H_3PO_4 \rightarrow 4(NH_4)_3PO_4 + 9SiO_2H_2O \quad \text{(Equation 1)}$$

The silicon compound material may include a silicon atom, an atomic group including an amino group combined with the silicon atom, and at least two oxygen atoms combined with the silicon atom. The atomic group including the amino group may be an amino alkyl group or an amino alkoxy group. According to an exemplary embodiment, the amino alkyl group or the amino alkoxy group may include 1 to 10 carbons.

In an exemplary embodiment, a content of the silicon compound material may be within the range of about 0.01 wt % to about 15 wt % in the etching composition.

The silicon compound material may be expressed by the following chemical formula 1 or 2.

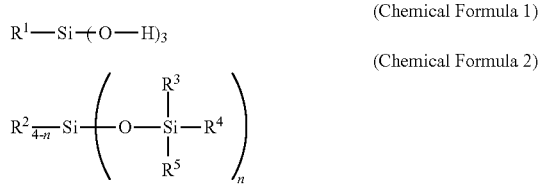

(Chemical Formula 1)

(Chemical Formula 2)

In the chemical formula 1, "$R^1$" denotes an amino alkyl group or an amino alkoxy group. For example, the silicon compound material may be an amino propyl silanetriol.

In the chemical formula 2, "$R^2$", "$R^3$", "$R^4$" and "$R^5$" denote hydrogen, an alkyl group, an amino alkyl group or an amino alkoxy group. In the chemical formula 2, "n" may be 2 or 3. According to an exemplary embodiment, at least one of "$R^2$", "$R^3$", "$R^4$" and "$R^5$" may be an amino alkyl group or an amino alkoxy group. For example, the silicon compound material may be a tri-(methyl, ethylamino-silane)methyl siloxane or a tri-(di-ethylamino-silane)amino propyl siloxane.

In the silicon compound material, bonds between silicon atoms and oxygen atoms may be unstable. Thus, the bonds between the silicon atoms and the oxygen atoms may be more easily broken. However, the amino groups included in the silicon compound material may stabilize the bonds between the silicon atom and the oxygen atoms. That is, the amino groups in the silicon compound material may minimize a byproduct generated by breaking the bonds between the silicon atoms and the oxygen atoms. Thus, the amino groups in the silicon compound material may suppress particle generation while the etching process is performed using the etching composition including the silicon compound material. Consequently, the amino groups in the silicon compound material may minimize process failures that may occur due to the particles in a subsequent process.

The oxygen atoms included in the silicon compound material may be combined with an oxide layer to protect the oxide layer. According to an exemplary embodiment, the oxygen atoms included in the silicon compound material may be combined with the oxide layer by a hydrogen bond. Thus, while a nitride layer (e.g., a silicon nitride layer) is etched using the etching composition according to an embodiment, an etch rate of an oxide layer (e.g., a silicon oxide layer) may be minimized. That is, an etch selectivity of the nitride layer to the oxide layer may be significantly increased.

In an exemplary embodiment, a content of the ammonium ions may be within the range of about 0.01 wt % to about 10 wt % in the etching composition.

The ammonium ions may be generated by adding a compound including ammonium ions to the etching composition. For example, the compound including ammonium ions may be an ammonia gas, an ammonium chloride, an ammonium phosphate, an ammonium acetate, an ammonium sulfate, an ammonium formate or an ammonium complex compound. The ammonium complex compound may be dissociated in the etching composition to generate ammonium ions.

In equation 1, the byproduct "$SiO_2H_2O$" may be adsorbed on a surface of an oxide layer while the silicon nitride material is etched. Thus, a thickness of the oxide layer may be increased. This phenomenon may be referred to as an abnormal growth. In particular, if the etching process for etching a nitride material is repeatedly performed in the etching composition, a concentration of the byproduct "$SiO_2H_2O$" in the etching composition may increase. As the concentration of the byproduct "$SiO_2H_2O$" increases, the abnormal growth phenomenon may occur more severely. That is, even though the abnormal growth phenomenon does not occur in an initial etching composition, the abnormal growth phenomenon may more severely occur as the number of the etching process performed in the etching composition increases. However, according to an exemplary embodiment, the ammonium ions may react or combine with the byproduct "$SiO_2H_2O$" to convert the byproduct "$SiO_2H_2O$" into a water-soluble compound. Thus, the ammonium ions in the etching composition may prevent the byproduct "$SiO_2H_2O$" from being adsorbed on an oxide layer. That is, the ammonium ions in the etching composition may suppress the abnormal growth phenomenon.

As described above, the etching composition according to an exemplary embodiment may include a phosphoric acid solution for etching a nitride material, a silicon compound material for protecting an oxide layer, and ammonium ions for converting the byproduct into a water-soluble compound. Thus, the silicon compound material in the etching composition may increase an etch selectivity of a nitride material to an oxide layer, and the ammonium ions in the etching composition may prevent the byproduct "$SiO_2H_2O$" from being adsorbed on an oxide layer to suppress the abnormal growth phenomenon.

Further, the silicon compound material in the etching composition may have stable bonding structures because of the presence of the atomic groups including amino groups. Thus, the amino groups in the silicon compound material may minimize byproducts generated by breaking the bonds between the silicon atoms and the oxygen atoms. Accordingly, the amino groups in the silicon compound material may suppress particle generation while the etching process is performed using the etching composition including the silicon compound material. Consequently, the amino groups in the silicon compound material may minimize process failures that occur due to the particles in a subsequent process.

Some experiments were carried out to evaluate effects of the etching compositions according to some exemplary embodiments. Various etching compositions according to first to third comparative examples and first to fifth exemplary embodiments were fabricated using some conditions listed in the following Table 1. All the etching compositions listed in Table 1 were fabricated to include phosphoric acid for etching a silicon nitride layer.

TABLE 1

|  | Compound 1 | Compound 2 | Ammonium Chloride | Additional Chemistry |
|---|---|---|---|---|
| Comparative Example 1 | X | X | X |  |
| Comparative Example 2 | X | X | X | TEOS (0.01 wt %) |
| Comparative Example 3 | X | X | X | Amino Propyl Triethoxy-Silane (0.1 wt %) |
| Exemplary Embodiment 1 | 0.5 wt % | X | X |  |
| Exemplary Embodiment 2 | 2.0 wt % | X | 1.0 wt % |  |
| Exemplary Embodiment 3 | X | 0.02 wt % | X |  |
| Exemplary Embodiment 4 | X | 0.02 wt % | 1.0 wt % |  |
| Exemplary Embodiment 5 | X | 0.02 wt % | 1.0 wt % |  |

Referring to Table 1, the etching composition according to the first comparative example was fabricated to include only phosphoric acid, and the etching composition according to the second comparative example was fabricated to include phosphoric acid of 99.99 wt % and tetra-ethyl-ortho-silicate (TEOS) of 0.01 wt %. Further, the etching composition according to the third comparative example was fabricated to include phosphoric acid of 99.9 wt % and amino propyl triethoxy-silane of 0.1 wt %. In the second comparative example, the TEOS has four bonds of oxygen to silicon but does not have any atomic groups including amino groups. In the third comparative example, the amino propyl triethoxy-silane includes atomic groups including amino groups but does not include at least two bonds of silicon to oxygen.

In Table 1, the first compound (e.g., a first silicon compound material) is amino propyl silane triol which is expressed by the chemical formula 1, and the second compound (e.g., a second silicon compound material) is tri-(methyl, ethylamino-silane)methyl siloxane or tri-(di-ethylamino-silane)amino propyl siloxane which is expressed by the chemical formula 2. The etching composition according to the first exemplary embodiment was fabricated to include phosphoric acid of 99.5 wt % and amino propyl silane triol of 0.5 wt %, and the etching composition according to the second exemplary embodiment was fabricated to include phosphoric acid of 97.0 wt %, amino propyl silane triol of 2.0 wt % and ammonium chloride of 1.0 wt %. Moreover, the etching composition according to the third exemplary embodiment was fabricated to include phosphoric acid of 99.98 wt %, tri-(methyl, ethylamino-silane)methyl siloxane of 0.02 wt %, and the etching composition according to the fourth exemplary embodiment was fabricated to include phosphoric acid of 98.98 wt %, tri-(methyl, ethylamino-silane)methyl siloxane of 0.02 wt % and ammonium chloride of 1.0 wt %. In addition, the etching composition according to the fifth exemplary embodiment was fabricated to include phosphoric acid of 98.98 wt %, tri-(di-ethylamino-silane)amino propyl siloxane of 0.02 wt % and ammonium chloride of 1.0 wt %.

A silicon nitride layer, a first silicon oxide layer and a second oxide layer were then dipped into each of the etching compositions fabricated according to the comparative examples and the exemplary embodiments. The etching compositions were maintained at a temperature of about 165° C. during the experiments, and the thickness variations of the silicon nitride layer, the first silicon oxide layer and the second oxide layer were measured after a predetermined time period to calculate etch rates thereof. In the present experiments, the first silicon oxide layer was formed using a thermal oxidation process and the second silicon oxide layer was formed using a high density plasma chemical vapor deposition (HDP CVD) process.

In the case of the second silicon oxide layer, the thickness of the second silicon oxide layer was measured before and after removal of byproduct generated by the silicon compound material added to the etching compositions in order to ascertain the amount of the byproduct. The byproduct was removed using a filter.

The thicknesses of the silicon nitride layer, the first silicon oxide layer and the second oxide layer were measured using an ellipsometer (NANO VIEW, SE MG-1000).

The etch rates of the silicon nitride layer, the first silicon oxide layer and the second oxide layer were summarized in the following Table 2 and illustrated in FIG. 1. Further, an etch selectivity of the silicon nitride layer to the silicon oxide layers was calculated using the etch rates of the silicon nitride layer and the first and second silicon oxide layers, and the etch selectivity were summarized in the following Table 3 and illustrated in FIG. 2.

TABLE 2

| Etch Rate (Å/min) | SiN | First SiO | Second SiO | |
|---|---|---|---|---|
| | | | Before Filter | After Filter |
| Comparative Example 1 | 73.14 | 1.52 | 4.37 | 4.37 |
| Comparative Example 2 | 73.34 | 0.0 | −0.03 | 4.3 |
| Comparative Example 3 | 74.72 | | 0.41 | 4.3 |
| Exemplary Embodiment 1 | 74.63 | | 0.41 | 0.41 |
| Exemplary Embodiment 2 | 75.41 | | 0.47 | 0.47 |
| Exemplary Embodiment 3 | 75.38 | | 0.50 | 0.50 |
| Exemplary Embodiment 4 | 74.84 | | 0.41 | 0.41 |
| Exemplary Embodiment 5 | 74.43 | | 0.45 | 0.45 |

TABLE 3

| Etch Selectivity | SiN/First SiO | SiN/Second SiO | |
|---|---|---|---|
| | | Before Filter | After Filter |
| Comparative Example 1 | 48.12 | 16.74 | 16.74 |
| Comparative Example 2 | ∞ | −2444.67 | 17.06 |
| Comparative Example 3 | | 182.24 | 17.38 |
| Exemplary Embodiment 1 | | 182.02 | 182.02 |
| Exemplary Embodiment 2 | | 160.45 | 160.45 |
| Exemplary Embodiment 3 | | 150.76 | 150.76 |
| Exemplary Embodiment 4 | | 182.54 | 182.54 |
| Exemplary Embodiment 5 | | 165.40 | 165.40 |

Referring to FIG. 1 and Table 2, an average etch rate of the silicon nitride layer in the etching compositions according to the third comparative example (CE3 of FIG. 1) and the first to fifth exemplary embodiments (EE1 to EE5 of FIG. 1) was about 74.9 angstroms/minute (Å/min), and an average etch rate of the silicon nitride layer in the etching compositions according to the first and second comparative examples (CE1 and CE2 of FIG. 1) and the first to fifth exemplary embodiments (EE1 to EE5 of FIG. 1) was about 73.24 angstroms/minute (Å/min). As described above, the etching composition according to the third comparative example CE3 was fabricated to include amino propyl triethoxy-silane containing atomic groups including amino groups. Further, the etching composition according to the first comparative example CE1 was fabricated not to include any silicon compound materials, and the etching composition according to the second comparative example CE2 was fabricated to include TEOS material without any atomic groups including amino groups.

To evaluate the influence of the silicon compound material including at least two bonds of silicon to oxygen, the etch rates of the second silicon oxide layers after filtering in some etching compositions can be compared. For example, an average etch rate of the second silicon oxide layers after filtering in the etching compositions including silicon compound materials having at least two bonds of silicon to oxygen (EE1 to EE5) was about 0.448 Å/min, and average etch rate of the second silicon oxide layers after filtering in the etching compositions without any bonds of silicon to oxygen (CE1 and CE3) was about 4.34 Å/min. That is, the average etch rate of the second silicon oxide layers (HDP oxide layers) after filtering in the etching compositions including at least two bonds of silicon to oxygen (EE1 to EE5) was significantly reduced about 89.67% as compared with the average etch rate of the second silicon oxide layers (HDP oxide layers) after filtering in the etching compositions without any bonds of silicon to oxygen (CE1 and CE3).

Figure 2:
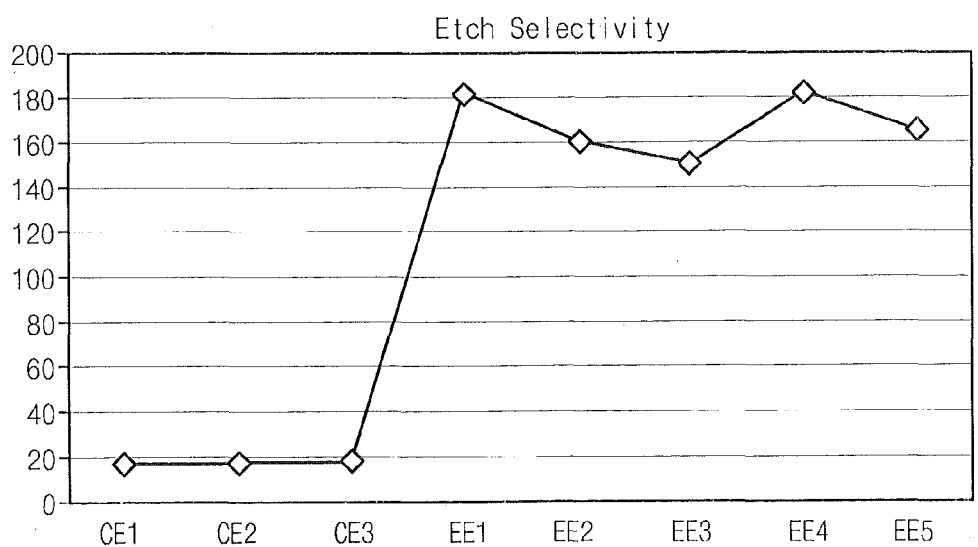
FIG. 2 is a graph illustrating an etch selectivity of a silicon nitride layer to a' silicon oxide layer when etching processes are performed using etchants according to exemplary embodiments and typical etchants according to comparative examples.

Referring to FIG. 2 and Table 3, the etch selectivity of the silicon nitride layer to the second silicon oxide layer after filtering in the etching compositions of the first to third comparative examples (CE1 to CE3) was less than 20, and the etch selectivity of the silicon nitride layer to the second silicon oxide layer after filtering in the etching compositions of the first to fifth exemplary embodiments (EE1 to EE5) was greater than 100.

Referring to Tables 2 and 3, the etch rate of the first oxide layer in the etching composition including only phosphoric acid (CE1) was 1.52 Å/min. In contrast, the first oxide layers were not etched in the etching compositions including a silicon compound material (CE2, CE3, and EE1 to EE5). That is, the etch rates of the first oxide layers in the etching compositions including a silicon compound material (CE2, CE3, and EE1 to EE5) were substantially 0.0 Å/min. This may be understood to mean that the etch selectivity of the silicon nitride layer to the first silicon oxide layer in the etching compositions including a silicon compound material (CE2, CE3, and EE1 to EE5) is infinite.

Moreover, referring to Tables 2 and 3, in case of the second and third comparative examples (CE2 and CE3), the etch rate of the second silicon oxide layer before filtering in the etching compositions was different from the etch rate of the second silicon oxide layer after filtering in the etching compositions. In this connection, the etch selectivity of the silicon nitride layer to the second oxide layer before filtering in the etching compositions of the second and third comparative examples (CE2 and CE3) was different from the etch selectivity of the silicon nitride layer to the second oxide layer after filtering in the etching compositions of the second and third comparative examples (CE2 and CE3). However, in case of the first to fifth exemplary embodiments (EE1 to EE5), the etch rate of the second silicon oxide layer before filtering in the etching compositions was equal to the etch rate of the second silicon oxide layer after filtering in the etching compositions. In this connection, the etch selectivity of the silicon nitride layer to the second oxide layer before filtering in the etching compositions of the second and third comparative examples (CE2 and CE3) was equal to the etch selectivity of the silicon nitride layer to the second oxide layer after filtering in the etching compositions of the second and third comparative examples (CE2 and CE3). This may be understood to mean that the TEOS material in the etching composition of the second comparative example (CE2) and the amino propyl triethoxy-silane in the etching composition of the third comparative example (CE3) are dissociated to generate a byproduct during the etching process. The byproduct may be adsorbed on the second silicon oxide layer to increase the thickness of the second oxide layer before filtering. However, the byproduct may be removed by filtering. Thus, the second silicon oxide layer may have an initial thickness thereof after filtering. Thus, in the second and third comparative examples (CE2 and CE3), the etch rate of the second silicon oxide layer and the etch selectivity of the silicon nitride layer to the second silicon oxide layer after filtering may be different from the etch rate of the second silicon oxide layer and the etch selectivity of the silicon nitride layer to the second silicon oxide layer before filtering.

Particularly, in case of the second comparative example (CE2), the etch rate of the second silicon oxide layer before filtering was measured to have a negative value after etching the second silicon oxide layer. This means that the thickness of the second silicon oxide layer is increased after the second silicon oxide layer is etched. However, the etch rate of the second silicon oxide layer after filtering was measured to have a similar value to the etch rate of the first comparative example (CE 1) using the etching composition consisting of only phosphoric acid. This may be understood to mean that Si—O bonds of the TEOS material in the etching composition of the second comparative example (CE2) are broken to generate a large amount Of byproduct and the byproduct is adsorbed on the second silicon oxide layer to increase the thickness of the second silicon oxide layer. Subsequently, if the byproduct is removed using a filtering process, the thickness of the second silicon oxide layer may be reduced. Thus, the etch rate of the second silicon oxide layer after filtering may be greater than the etch rate of the second silicon oxide layer before filtering.

Consequently, it may be recognized that the first silicon compound material or a second silicon compound material included in each of the first to fifth exemplary embodiments (EE1 to EE5) has a more stable bonding structure than the TEOS material and the amino propyl triethoxy-silane.

The byproduct generated in the etching composition including the TEOS material may be adsorbed on a film (e.g., the second silicon oxide layer) to increase the thickness of the film after the etching process. This phenomenon may correspond to an abnormal growth, as described above. The byproduct may generate particles. The abnormal growth and the particles may cause various process failures in a subsequent process.

Surfaces of the second silicon oxide layers dipped in the various etching compositions were scanned using a scanning electron microscope (SEM) to inspect particles, and the particle inspection results were summarized in the following Table 4. Further, vertical cross sectional views of the second silicon oxide layers dipped in the various etching compositions were taken using a scanning electron microscope (SEM) to inspect an abnormal growth phenomenon, and the abnormal growth inspection results were also summarized in the following Table 4.

TABLE 4

|  | Particles | Abnormal Growth |
|---|---|---|
| Comparative Example 1 | No Particles | Abnormal Growth Found |
| Comparative Example 2 | Particles Found | Abnormal Growth Found |
| Comparative Example 3 | Particles Found | Abnormal Growth Found |
| Exemplary Embodiment 1 | No Particles | No Abnormal Growth |
| Exemplary Embodiment 2 | No Particles | No Abnormal Growth |
| Exemplary Embodiment 3 | No Particles | No Abnormal Growth |
| Exemplary Embodiment 4 | No Particles | No Abnormal Growth |
| Exemplary Embodiment 5 | No Particles | No Abnormal Growth |

Figure 4:
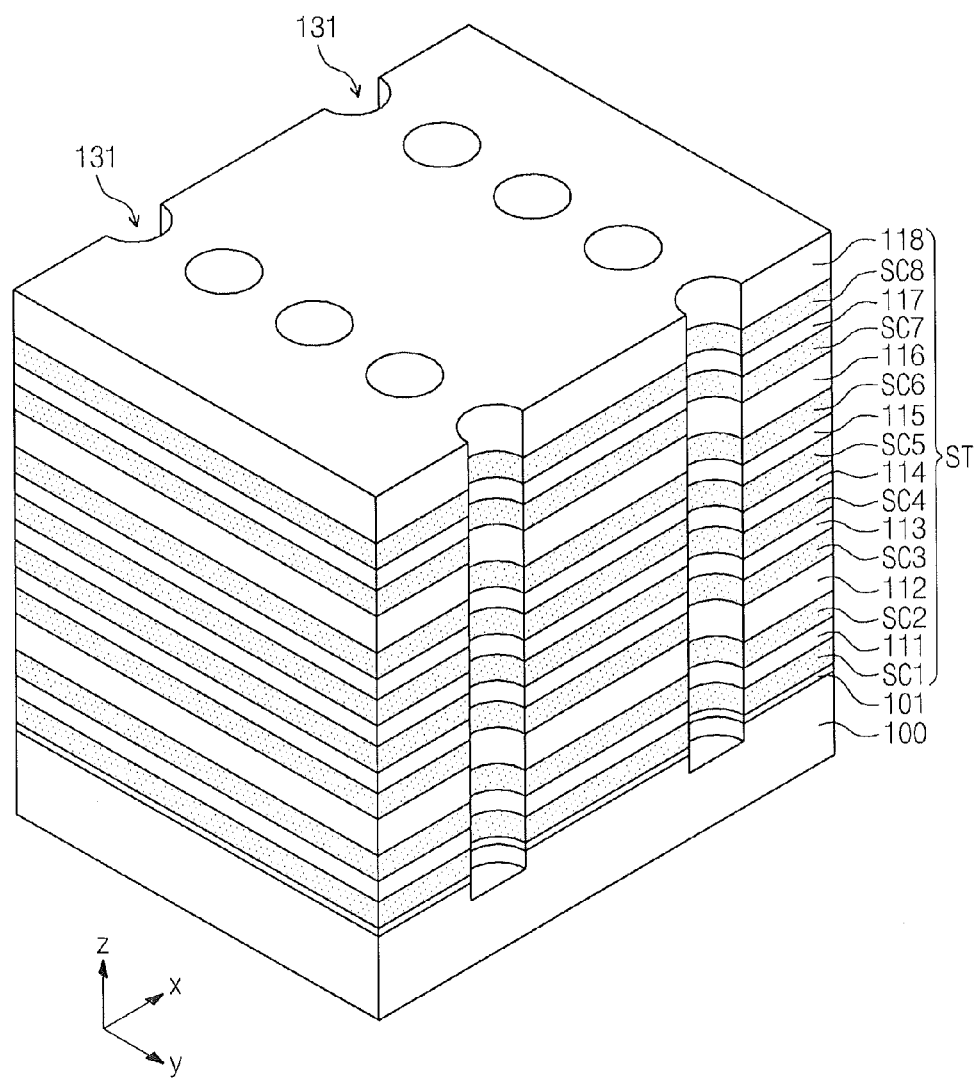

Referring to FIG. 4, according to the first to fifth exemplary embodiments (EE1 to EE5), neither the particles nor the abnormal growth were found. However, the abnormal growth of the second silicon oxide layer was found in the first comparative example (CE1), and both the particles and the abnormal growth were found in the second and third comparative examples (CE2 and CE3). Consequently, it may be recognized that all the etching compositions according to the first to fifth exemplary embodiments (EE1 to EE5) can suppress the particle generation and the abnormal growth phenomenon.

Methods of Fabricating a Semiconductor Device

Now, a method of fabricating a semiconductor device using some etching compositions according to some exemplary embodiments will be described with reference to FIGS. 3 to 10. FIGS. 3 to 10 are perspective views illustrating a method of forming a semiconductor device using some etching compositions according to some exemplary embodiments.

Figure 3:
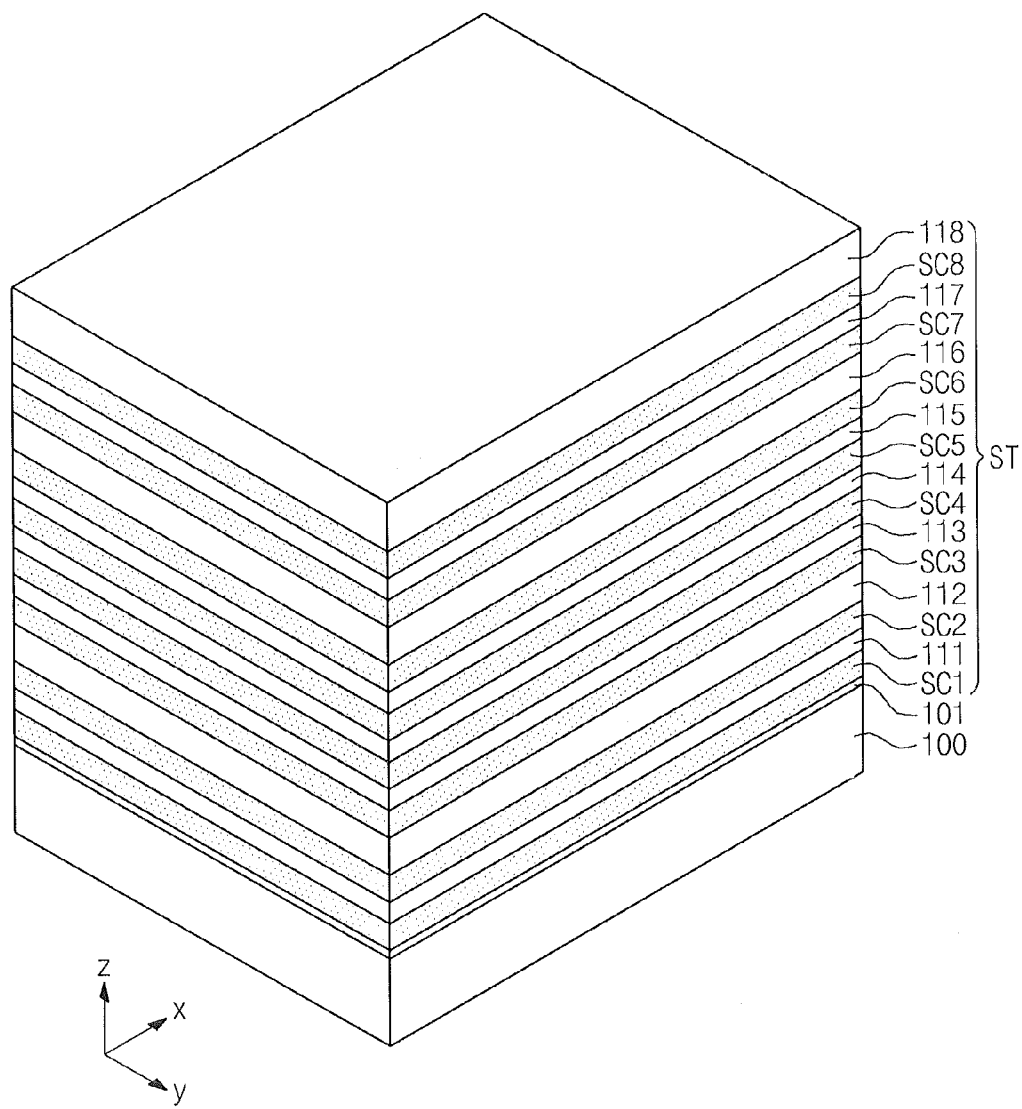
FIGS. 3 to 10 are perspective views illustrating a method of forming a semiconductor device using etching compositions according to some exemplary embodiments.

Referring to FIG. 3, a stack structure ST may be formed on a substrate 100. The substrate 100 may be one of a semiconductor substrate (e.g., a silicon wafer, a silicon layer, a germanium layer or a silicon-germanium layer), an insulation substrate (e.g., an insulation layer such as an oxide layer, a nitride layer or a glass layer), and a semiconductor layer covered with an insulation layer.

The stack structure ST may be formed by alternately and repeatedly stacking sacrificial layers SC1-SC8 and oxide layers 111-118. The sacrificial layers SC1-SC8 may be formed of a material layer having an etch selectivity with respect to the oxide layers 111-118. Similarly, the oxide layers 111-118 may be formed of a material layer having an etch selectivity with respect to the sacrificial layers SC1-SC8. For example, the oxide layers 111-118 may be formed of a silicon oxide layer, and the sacrificial layers SC1-SC8 may be formed of a silicon nitride layer.

According to an exemplary embodiment, the sacrificial layers SC1-SC8 may be formed to have the same thickness. Alternatively, a lowermost sacrificial layer SC1 and an uppermost sacrificial layer SC8 of the sacrificial layers SC1-SC8 may be formed to be thicker than the other sacrificial layers SC2-SC7 between the lowermost sacrificial layer SC1 and the uppermost sacrificial layer SC8. In this case, the sacrificial layers SC2-SC7 between lowermost sacrificial layer SC1 and the uppermost sacrificial layer SC8 may be formed to have the same thickness.

According to an exemplary embodiment, an uppermost oxide layer 118 of the oxide layers 111-118 may be formed to be thicker than the other oxide layers 111-117 under the uppermost oxide layer 118. In this case, the oxide layers 111-117 under the uppermost oxide layer 118 may be formed to have the same thickness. Alternatively, predetermined oxide layers 112 and 116 of the oxide layers 111-118 may be formed to be thicker than the other oxide layers 111, 113, 114, 115 and 117, as illustrated in FIG. 3.

A buffer insulation layer 101 may be formed between the lowermost sacrificial layer SC1 and the substrate 100. The buffer insulation layer 101 may be formed to be thinner than the oxide layers 111-118. The buffer insulation layer 101 may be a silicon oxide layer formed using a thermal oxidation process.

Referring to FIG. 4, the stack structure ST may be patterned to form openings 131 that expose the substrate 100.

Specifically, forming the openings 120 may include forming a mask pattern (not shown) on the stack structure ST to define planar positions of the openings 131 and anisotropically etching the stack structure ST using the mask pattern as an etch mask.

The openings 131 may be formed to expose sidewalls of the sacrificial layers SC1-SC8 and the oxide layers 111-118. Further, according to an exemplary embodiment, the openings 131 may be formed to penetrate the buffer insulation layer 101 and to expose the substrate 100. While the openings 131 are formed, the substrate 100 may be over-etched to form recessed regions. Each of the openings 131 may have different widths according to a distance from the substrate 100. That is, each of the openings 131 may be formed to have a sloped sidewall. This may be due to the nature of the anisotropic etching process.

According to an embodiment, each of the openings 131 may be formed to have a circular shape or a polygonal shape in a plan view, and the openings 131 may be two dimensionally and regularly arrayed in an x-y plane parallel with a top surface of the substrate 100. That is, the openings 131 may be arrayed in columns parallel with an x-axis and in rows parallel with a y-axis in a plan view. According to some other exemplary embodiments, although not shown in the drawings, the openings 131 may be formed to have a line-shaped groove configuration parallel with the y-axis in a plan view. That is, the line-shaped openings may be formed to be parallel with each other. According to some other embodiments, although not shown in the drawings, the openings 131 may be arrayed zigzag along the y-axis direction. In this case, the number of the openings 131 arrayed in a unit length parallel with the y-axis may be increased even without reduction of a substantial distance between the adjacent openings 131. Accordingly, the integration density of the openings 131 may be increased.

Figure 5:
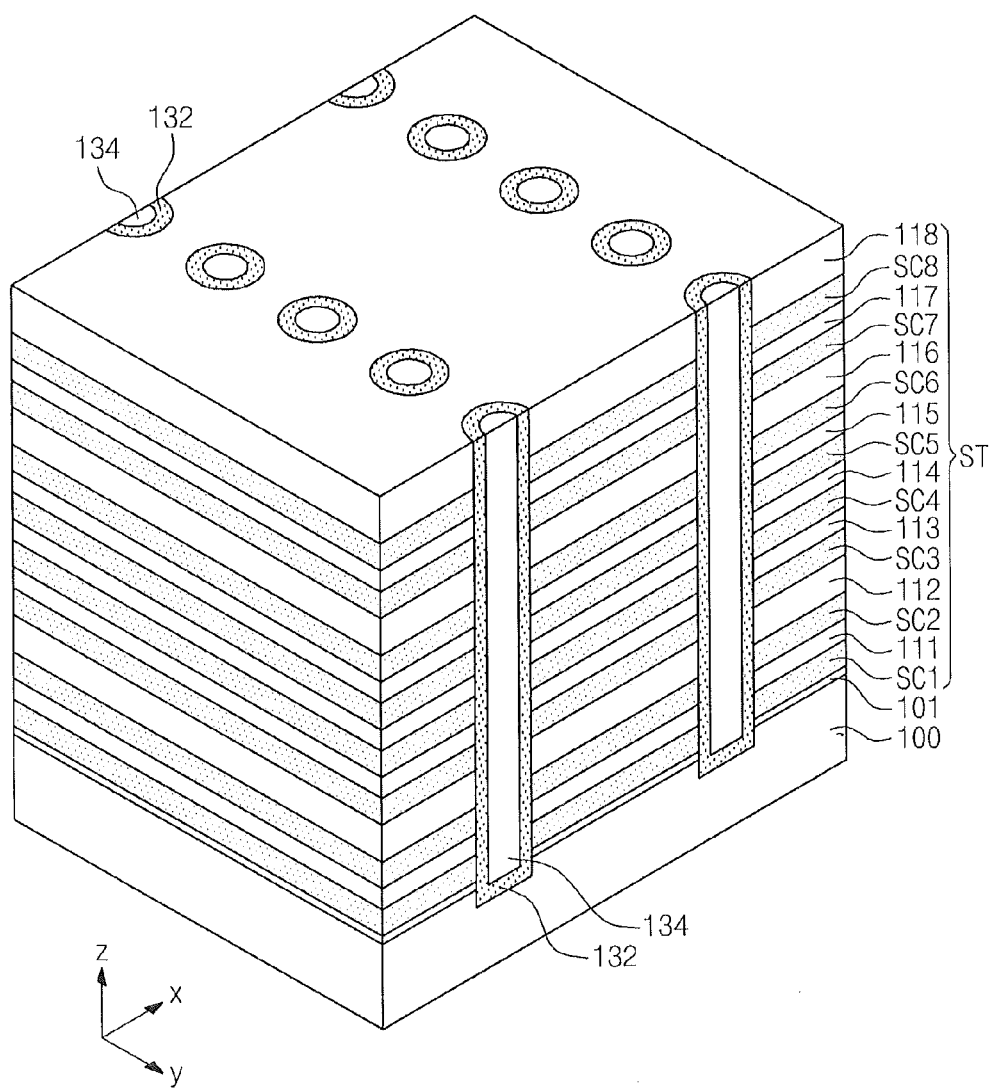

Referring to FIG. 5, semiconductor patterns 132 may be formed in respective ones of the openings 131.

Specifically, the semiconductor patterns 132 may be formed in the openings 131 to directly contact the substrate 100. The semiconductor patterns 132 in the openings 131 may be substantially perpendicular to the substrate 100. The semiconductor patterns 132 may be formed of a silicon layer, a germanium layer or a silicon-germanium layer. The semiconductor patterns 132 may be formed of a doped semiconductor layer (e.g., an extrinsic semiconductor layer doped with impurities) or an undoped semiconductor layer (e.g., an intrinsic semiconductor layer). Further, the semiconductor patterns 132 may be formed to have at least one of an amorphous structure, a polycrystalline structure and a single crystalline structure.

To form the semiconductor patterns 132, a semiconductor layer may be formed in the openings 131 and on the stack structure ST using a deposition process, for example, a chemical vapor deposition (CVD) process or an atomic layer deposition (ALD) process. In the event that the semiconductor layer is formed using a deposition process, a discontinuous interface may be formed between the semiconductor layer and the substrate 100. This may be due to a difference between a crystallographic structure of the semiconductor layer and a crystallographic structure of the substrate 100. In some embodiments, the semiconductor layer may be formed by depositing an amorphous silicon layer or a polycrystalline silicon layer and by crystallizing the amorphous or polycrystalline silicon layer using a thermal treatment process such as a laser annealing process. In this case, the semiconductor layer may be formed to have a single crystalline structure. In some other embodiments, the semiconductor patterns 132 may be formed in the openings 131 using an epitaxial growth process that employs the substrate 100 exposed by the openings 131 as a seed layer.

Moreover, the semiconductor layer may be deposited to a thickness which is less than half a width of the openings 131. In this case, the semiconductor layer may be conformally formed in the openings 131. That is, the semiconductor layer may be formed to partially fill the openings 131 to provide empty regions in respective ones of the openings 131. In addition, the semiconductor layer may be deposited to a thickness which is less than a width of a depletion layer formed in the semiconductor patterns 132 during operation of a semiconductor device. Alternatively, the semiconductor layer may be deposited to a thickness which is less than an average length of silicon grains constituting the semiconductor patterns 132 having a polycrystalline structure. The semiconductor patterns 132 in the openings 131 may be formed to have a pipe-shaped configuration, a hollow cylinder-shaped configuration or a cup-shaped configuration. Each of the empty regions surrounded by the semiconductor layer patterns 132 in the openings 131 may be filled with a buried insulation pattern 134. The buried insulation pattern 134 may be formed of an insulation material having an excellent gap filling characteristic. For example, buried insulation pattern 135 (not shown) may be formed of an HDP oxide layer, a spin on glass (SOG) layer and/or a CVD oxide layer.

In some embodiments, although not shown in the drawings, the semiconductor layer may be formed to completely fill the openings 131 using a deposition process. In this case, the semiconductor layer may be planarized to form pillar-shaped semiconductor patterns in respective ones of the openings 131.

In the event that the openings 131 are formed to have a line shape, a plurality of semiconductor patterns may be arrayed along a y-axis direction in each of the line-shaped openings and the plurality of semiconductor patterns in each of the line-shaped openings may be separated from each other by insulation patterns. The semiconductor patterns in the line-shaped openings may be formed by sequentially forming a semiconductor layer and a buried insulation layer in the line-shaped openings, planarizing the buried insulation layer and the semiconductor layer, and patterning the planarized buried insulation layer and the planarized semiconductor layer. Thus, each of the semiconductor patterns may be formed to have a rectangular shape in a plan view parallel with the x-y plane. Further, each of the semiconductor patterns may be formed to have a 'U'-shaped configuration in a vertical cross sectional view parallel with an x-z plane.

Figure 6:
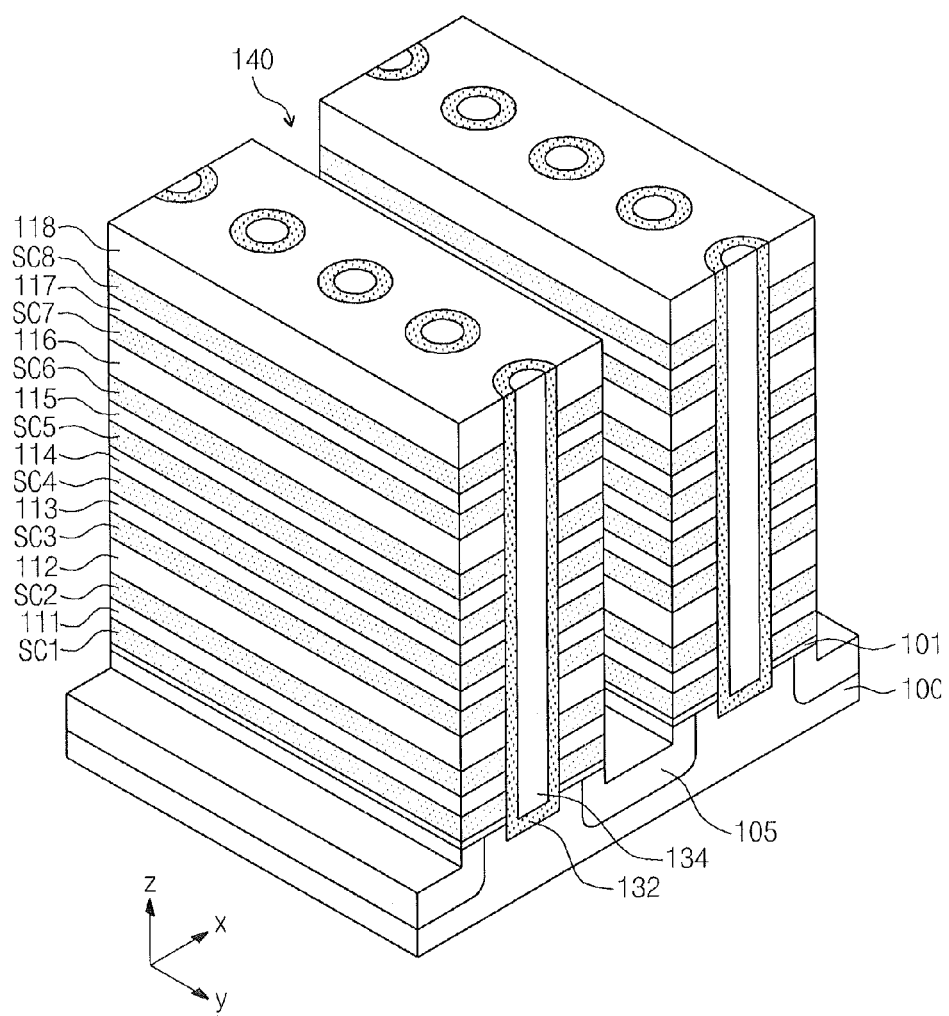

Referring to FIG. 6, after formation of the semiconductor patterns 132, the stack structure ST may be patterned to form trenches 140 being parallel with the y-axis and exposing the substrate 100.

Specifically, forming the trenches 140 may include forming a mask pattern (not shown) on the stack structure ST to define planar positions of the trenches 140 and anisotropically etching the stack structure ST using the mask pattern as an etch mask.

The trenches 140 may be formed to be spaced apart from the semiconductor patterns 132 and to have sidewalls exposing the sacrificial layers SC1-SC8 and the insulation layers 111-118. In a plan view, the trenches 140 may be formed to have a line shape or a rectangular shape. Further, the trenches 140 may be formed to have a depth which is capable of exposing the substrate 100. In addition, a width of each of the trenches 140 may be varied according to a distance from the substrate 100. That is, each of the trenches 140 may be formed to have sloped sidewalls. This may be due to the nature of the anisotropic etching process. While the trenches 140 are formed, the substrate 100 may be over-etched to form recessed regions having a predetermined depth.

The trenches 140 may divide the stack structure ST into a plurality of preliminary gate structures. Each of the preliminary gate structures may include sacrificial patterns SC1-SC8 and oxide patterns 111-118 which are alternately and repeatedly stacked. The preliminary gate structures may be formed to have a line shape extending in the y-axis direction. The semiconductor patterns 132 arrayed in a single row parallel with the y-axis may penetrate one of the preliminary gate structures. Each of the preliminary gate structures may include inner sidewalls adjacent to the semiconductor patterns 132 and outer sidewalls exposed by the trenches 140.

According to an embodiment, after the trenches 140 are formed, impurity regions 105 may be formed in the substrate 100. The impurity regions 105 may be formed using an ion implantation process that employs the preliminary gate structures as ion implantation masks. The impurity regions 105 may be diffused to overlap with edge portions of the preliminary gate structures during subsequent annealing processes. The impurity regions 105 may be formed to have an opposite conductivity type to the substrate 100. In another exemplary embodiment, after formation of the trenches 140, the process for forming the impurity regions 105 may be omitted. That is, the impurity regions 105 may be formed in a subsequent process.

Figure 7:
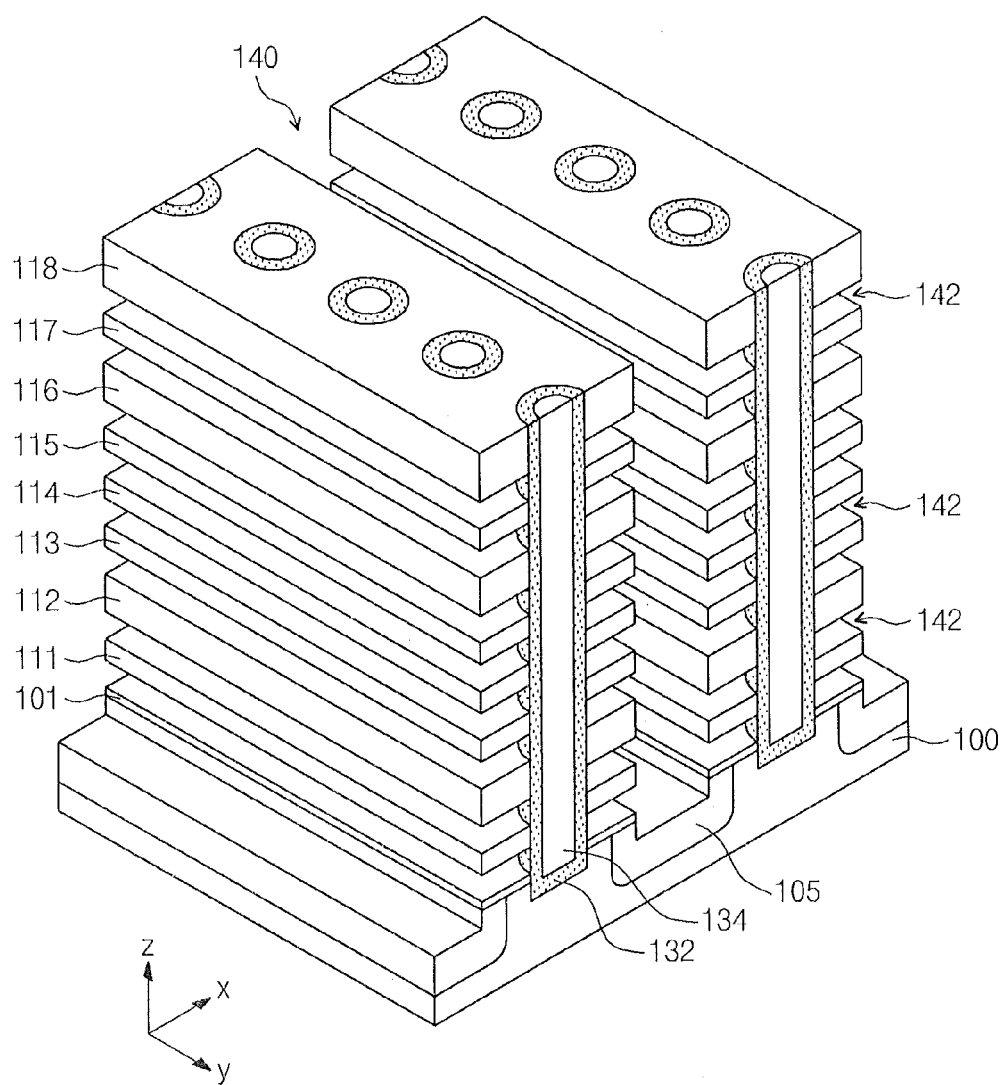

Referring to FIG. 7, the sacrificial patterns SC1-SC8 exposed by the trenches 140 may be removed to form recessed regions 142 between the oxide patterns 111-118 vertically stacked.

The sacrificial patterns SC1-SC8 may be removed using a wet etching process that employs one of the etching compositions according to the exemplary embodiments as an etchant. The etching composition for removing the sacrificial patterns SC1-SC8 may include phosphoric acid, silicon compound material and ammonium ions. The phosphoric acid may react on the sacrificial patterns SC1-SC8 to etch the sacrificial patterns SC1-SC8.

According to an exemplary embodiment, the silicon compound material may be added to the etching composition to have a composition ratio of about 0.01 wt% to about 15 wt%, and the ammonium ions may be added to the etching composition to have a composition ratio of about 0.01 wt% to about 10 wt%.

The silicon compound material may include a silicon atom, an atomic group including an amino group ($-NH_2$) combined with the silicon atom, and at least two oxygen atoms combined with the silicon atom. The atomic group including the amino group ($-NH_2$) may be an amino alkyl group or an amino alkoxy group. According to an exemplary embodiment, the amino alkyl group or the amino alkoxy group may include 1 to 10 carbons.

The silicon compound material may be expressed by the chemical formula 1 or 2 described above. In the chemical formula 1, "$R^1$" denotes an amino alkyl group or an amino alkoxy group. For example, the silicon compound material may be an amino propyl silanetriol. In the chemical formula 2, "$R^2$", "$R^3$", "$R^4$" and "$R^5$" may be hydrogen, an amino alkyl group, an alkyl group or an amino alkoxy group. In the chemical formula 2, "n" may be 2 or 3. According to an exemplary embodiment, at least one of "$R^2$", "$R^3$", "$R^4$" and "$R^5$" may be an amino alkyl group or an amino alkoxy group. For example, the silicon compound material may be a tri-(methyl, ethylamino-silane)methyl siloxane or a tri-(di-ethylamino-silane)amino propyl siloxane.

The silicon compound material may have stable bonding structures at least because of the presence of the atomic groups including amino groups. If the bonding structures of the silicon compound material are broken, a byproduct may be generated in the etching composition and the byproduct may generate particles. The particles may be adsorbed on the substrate 100 and/or the oxide patterns 111-118 to cause process failures in a subsequent process. However, since the silicon compound material may have stable bonding structures, the silicon compound material may suppress particle generation and/or minimize the process failures. Thus, a high reliable semiconductor device may be realized.

Further, the oxygen atoms included in the silicon compound material may be combined with the oxide patterns 111-118 to protect the oxide patterns 111-118. Thus, while the sacrificial patterns SC1-SC8 are etched using the etching composition according to an exemplary embodiment, the silicon compound material may minimize an etch rate of the oxide patterns 111-118 and may prevent the oxide patterns 111-118 from being damaged.

Moreover, the ammonium ions may react or combine with the byproduct generated in the etching composition to convert the byproduct into a water-soluble compound. Thus, the ammonium ions in the etching composition may prevent the byproduct from being adsorbed on the oxide patterns 111-118. That is, the ammonium ions in the etching composition may prevent a thickness of the oxide patterns 111-118 from being increased.

As described above, the recessed regions 142 may be formed by removing the sacrificial patterns SC1-SC8 between the oxide patterns 111-118. That is, the recessed regions 142 may be formed to laterally extend from the trenches 140 into regions between the oxide patterns 111-118. Thus, the recessed regions 142 may expose portions of outer sidewalls of the semiconductor patterns 132. Lowermost recessed regions 142 may be defined by the buffer insulation layer 101 and the lowermost insulation patterns 111. Thus, a vertical thickness (e.g., a width in a z-axis direction) of the recessed regions 142 may be determined by a deposition thickness of the sacrificial layers SC1-SC8 described with reference to FIG. 3.

Figure 8:
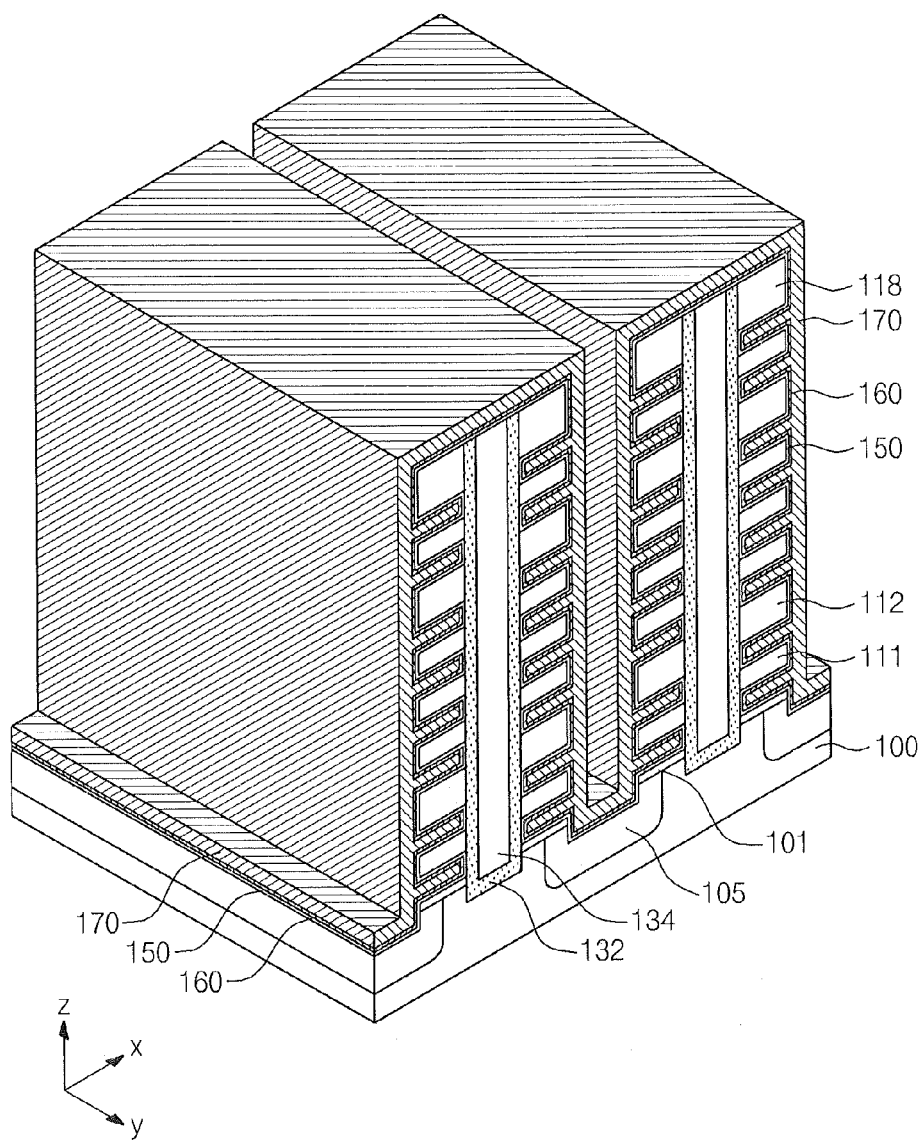

Referring to FIG. 8, a multi-layered dielectric film 150 may be formed in the recessed regions 142.

The multi-layered dielectric film 150 may be formed to conformally cover the preliminary gate structures including the recessed regions 142. The multi-layered dielectric film 150 may be formed using a deposition process (e.g., a CVD process or an ALD process) which is capable of providing an excellent step coverage. The multi-layered dielectric film 150 may be formed to a thickness which is less than half of the vertical thickness of the recessed regions 142. That is, the multi-layered dielectric film 150 may be formed on the exposed portions of the sidewalls of the semiconductor patterns 132, and the multi-layered dielectric film 150 may be formed to extend onto bottom and top surfaces of the oxide patterns 111-118 defining the recessed regions 142. In addition, the multi-layered dielectric film 150 may be formed to cover the substrate 100 exposed by the trenches 140, top surfaces of the uppermost oxide patterns 118 and sidewalls of the oxide patterns 111-118. Moreover, the multi-layered dielectric film 150 may be formed to cover top surfaces of the buffer insulation layers 101 (or a top surface of the substrate 100) exposed by the recessed regions 142. That is, the multi-layered dielectric film 150 may be conformally formed on surfaces of the preliminary gate structures including the recessed regions 142.

According to an exemplary embodiment, the multi-layered dielectric film 150 may be formed to include a charge storage layer. For example, the charge storage layer may be a material layer including one of a trap insulation layer, a floating gate electrode and conductive nano-dots. Data stored in the charge storage layer may be changed using a Fowler-Nordheim (FN) tunneling phenomenon. Alternatively, the multi-layered dielectric film 150 may be formed to include another material layer in which data are stored by a different mechanism from the FN tunneling phenomenon. For example, the multi-layered dielectric film 150 may be formed of a phase change material used in phase change memory cells (e.g., PRAM cells) or a variable resistive material used in resistive memory cells (e.g., RRAM cells).

According to an exemplary embodiment, the multi-layered dielectric film 150 may further include a blocking insulation layer and a tunnel insulation layer. In this case, the charge storage layer may be disposed between the blocking insulation layer and the tunnel insulation layer. The blocking insulation layer may include at least one of a silicon oxide layer, a silicon nitride layer, a silicon oxynitride layer and high-k dielectric layers. The high-k dielectric layers may include insulation layers having a dielectric constant which is higher than that of a silicon oxide layer. For example, the high-k dielectric layers may include a tantalum oxide (TaO) layer, a titanium oxide (TiO) layer, a hafnium oxide (HfO) layer, a zirconium oxide (ZrO) layer, an aluminum oxide (AlO) layer, a yttrium oxide (YO) layer, a niobium oxide (NbO) layer, a cesium oxide (CsO) layer, an indium oxide (InO) layer, an iridium oxide (IrO) layer, a barium strontium titanate (BST) layer, and a lead zirconate titanate (PZT) layer. The tunnel insulation layer may be formed of a material layer having a dielectric constant which is lower than that of the blocking insulation layer. For example, the tunnel insulation layer may be formed to include at least one of an oxide layer, a nitride layer and an oxynitride layer.

Figure 9:
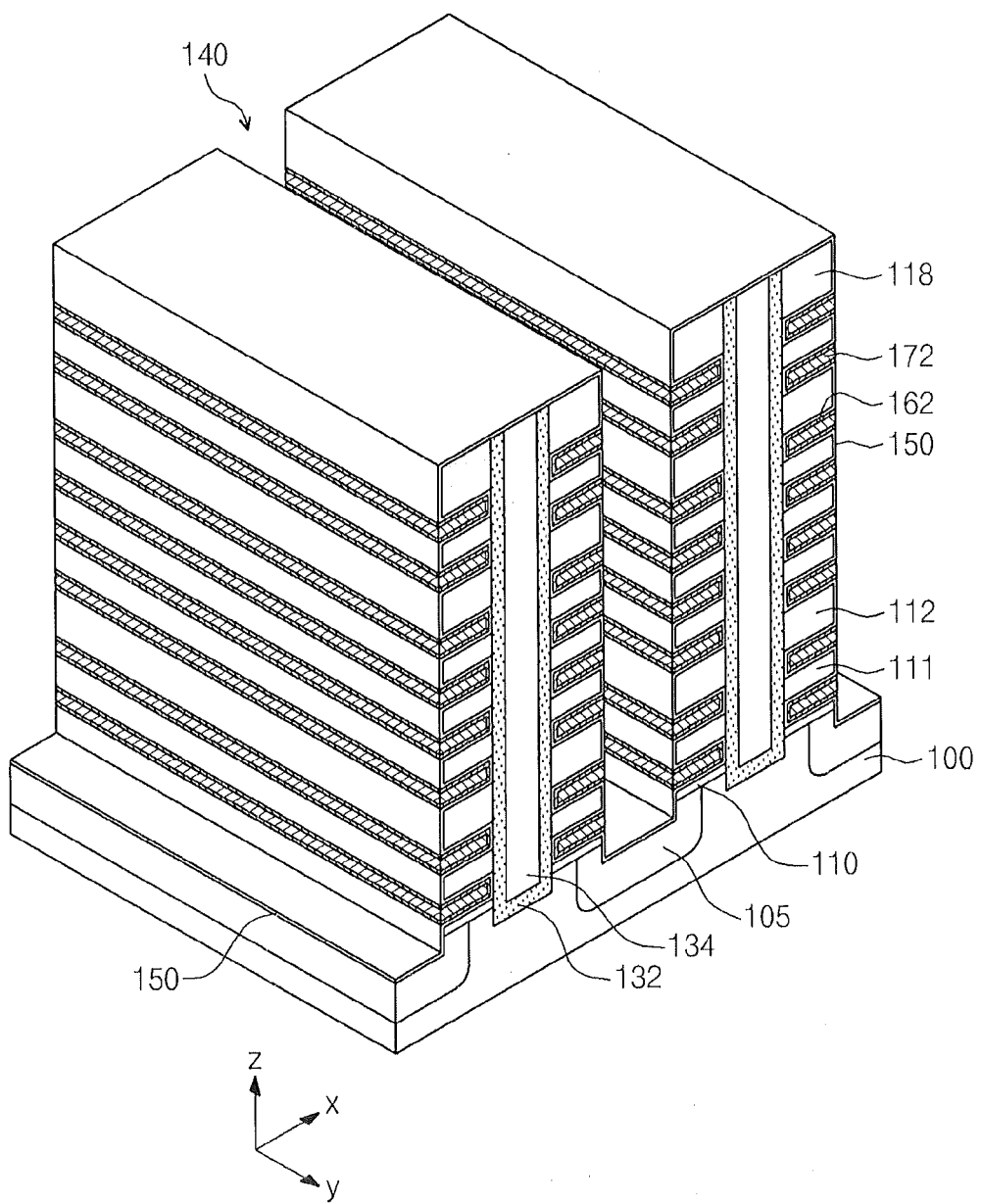
Figure 10:
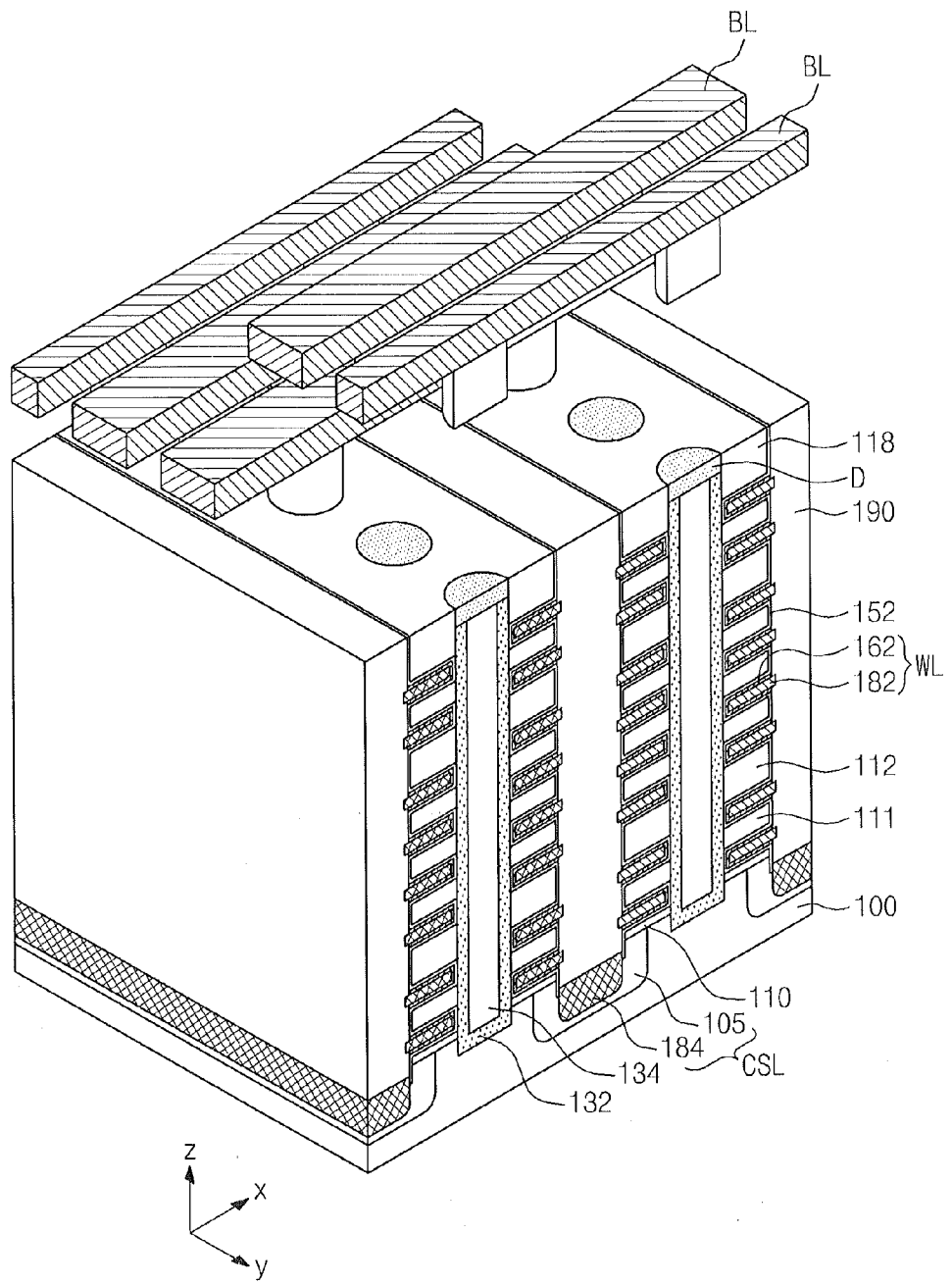

Referring to FIGS. 8, 9 and 10, gate electrodes WL and common source lines CSL may be formed in the recessed regions 142 and the substrate 100, respectively. The gate electrodes WL may be formed in respective ones of the recessed regions 142 surrounded by the multi-layered dielectric film 150. Thus, a vertical thickness of each of the gate electrodes WL may be less than the vertical thickness of each of the recessed regions 142. The reduction of the vertical thickness of the gate electrodes WL may result in increase of electrical resistance of the gate electrodes WL. Thus, it may be preferable that the gate electrodes WL are formed of a conductive layer having a low resistivity to improve the electrical characteristics and the integration density of a semiconductor device.

According to an exemplary embodiment, the gate electrodes WL and the common source lines CSL may be formed of a metal layer having a low resistivity. For example, the gate electrodes WL and the common source lines CSL may be formed of a tungsten layer.

The common source lines CSL may be the impurity regions 105 formed in the substrate 100. However, in the event that the impurity regions 105 act as the common source lines CSL, the electrical resistance of the common source lines CSL may be non-uniform and may be relatively high.

According to some other exemplary embodiments, each of the common source lines CSL may be formed to include the impurity region 105 and a source metal silicide layer 184. If each of the common source lines CSL is formed to include the source metal silicide layer 184, the electrical resistance of the common source lines CSL may be reduced as compared with the common source lines CSL including only the impurity regions 105. In some exemplary embodiments, each of the gate electrodes WL may be formed to include a polysilicon layer 162 and a gate metal silicide layer 182. In this case, the source metal silicide layers 184 and the gate metal silicide layers 182 may be simultaneously formed.

According to an exemplary embodiment, while the gate electrodes WL are formed, the common source lines CSL may be formed to include the source metal silicide layer 184. A method of forming the gate electrodes WL and the common source lines CSL will be described more fully hereinafter with reference to FIGS. 8, 9 and 10.

Forming the gate electrodes WL and the common source lines CSL may include sequentially forming a doped polysilicon layer 160 and a gate conductive layer 170 in the recessed regions 142 and the trenches 140 surrounded by the multi-layered dielectric film 150, and selectively removing the doped polysilicon layer 160 and the gate conductive layer 170 in the trenches 140. Thus, the gate electrodes WL may be formed in respective ones of the recessed regions 142 and may be vertically separated from each other.

The gate conductive layer 170 may be formed using a deposition process (e.g., a CVD process or an ALD process) which is capable of providing an excellent step coverage. Thus, the gate conductive layer 170 may be formed to fill the recessed regions 142 and to conformally cover inner walls of the trenches 140. Specifically, the gate conductive layer 170 may be formed to a thickness which is greater than a half of the vertical thickness of the recessed regions 142. If a width of the trenches 140 is greater than the vertical thickness of the recessed regions 142, the gate conductive layer 170 may be conformally formed in the trenches 140, thereby providing an empty region surrounded by the gate conductive layer 170 in each of the trenches 140. Accordingly, the empty regions may be upwardly opened.

The gate conductive layer 170 may be formed to include at least one of a tungsten layer, a metal nitride layer and a metal silicide layer. According to an exemplary embodiment, the gate conductive layer 170 may be formed by sequentially stacking a barrier metal layer 161 (e.g., a metal nitride layer) and a metal layer 163 (e.g., a tungsten layer). The exemplary embodiments may be applied to semiconductor memory devices, for example, flash memory devices. However, the exemplary embodiments may not be limited to the flash memory devices. That is, the gate conductive layer 170 may be formed to have various materials and structures different from the above descriptions.

Subsequently, the doped polysilicon layer 160 and the gate conductive layer 170 may be anisotropically etched to form the gate electrodes WL vertically separated from each other.

Specifically, removing the doped polysilicon layer 160 and the gate conductive layer 170 in the trenches 140 may include forming a hard mask pattern (not shown) on the uppermost oxide patterns 118 constituting the preliminary gate structures, and anisotropically etching the gate conductive layer 170 and the doped polysilicon layer 160 using the hard mask pattern as an etch mask. Alternatively, removing the doped polysilicon layer 160 and the gate conductive layer 170 in the trenches 140 may include isotropically etching the gate conductive layer 170 and the doped polysilicon layer 160 without use of the hard mask pattern. When the doped polysilicon layer 160 and the gate conductive layer 170 in the trenches 140 are removed, the multi-layered dielectric film 150 on the substrate 100 may act as an etch stop layer.

As described above, the multi-layered dielectric film 150 on the substrate 100 may be exposed after formation of the gate electrodes WL. Alternatively, while the gate electrodes WL are formed, the multi-layered dielectric film 150 on the substrate 100 may be etched to expose the substrate 100. In this case, the substrate 100 may be over etched to form recessed regions in the substrate 100, as illustrated in the drawings.

According to an exemplary embodiment, the gate electrodes WL and the oxide patterns 111-118 disposed between the pair of adjacent trenches 140 may constitute a gate structure. According to an exemplary embodiment, each of the gate structures between the trenches 140 may have a line shape extending in one direction, for example, in the y-axis direction. The semiconductor patterns 132 arrayed in one row parallel with the y-axis may penetrate one of the gate structures. Each of the gate structures may include inner sidewalls adjacent to the semiconductor patterns 132 and outer sidewalls adjacent to the trenches 140. The semiconductor patterns 132 may be surrounded by inner sidewalls of the gate electrodes WL.

According to an exemplary embodiment, the gate electrodes WL penetrating each of the gate structures may be used as a string selection line, a ground selection line and word lines. For example, an uppermost gate electrode of the gate electrodes WL may act as the string selection line, and a lowermost gate electrode of the gate electrodes WL may act as the ground selection line. Further, the gate electrodes WL between the uppermost gate electrode and the lowermost gate electrode may act as the word lines.

Referring to FIG. 10, as described with reference to FIG. 6, the impurity regions 105 may not be formed after formation of the gate electrodes WL. In this case, the impurity regions 105 may be formed after formation of the gate electrodes WL. That is, the impurity regions 105 may be formed by injecting impurities into the substrate 110 under the trenches 140 between the gate structures including the gate electrodes WL.

Specifically, the impurity regions 105 may be formed using an ion implantation process that employs the gate structures as ion implantation masks. Thus, each of the impurity regions 105 may be formed to have a line shape that is parallel to the y-axis in a plan view. The impurity regions 105 may be diffused to overlap with edge portions of the gate structures through a subsequent annealing process. The impurity regions 105 may be formed to have an opposite conductivity type to the substrate 100.

While the impurity regions 105 are formed after formation of the gate electrodes WL, the multi-layered dielectric film 150 on the substrate 100 may act as an ion implantation buffer layer.

According to an exemplary embodiment, the multi-layered dielectric film 150 on the impurity regions 105 may be removed, and the impurity regions 105 may react on a metal layer 180 using a silicidation process. Consequently, the source metal silicide layers 184 may be formed on the impurity regions 105.

Subsequently, gate isolation patterns 190 may be formed in a respective one of the trenches 140.

Forming the gate isolation patterns 190 may be formed of an insulation layer. For example, the gate isolation patterns 190 may be formed to include at least one of a silicon oxide layer, a silicon nitride layer and an oxynitride layer. According to some other exemplary embodiments, a capping layer may be formed on the substrate including the gate electrodes WL, the impurity regions 105 or the source metal silicide layers 184, prior to formation of the gate isolation patterns 190. The capping layer may be formed to prevent the gate electrodes WL and the source metal silicide layers 184 from being oxidized. The capping layer may be formed of an insulating nitride layer, for example, a silicon nitride layer.

After formation of the gate isolation patterns 190, impurities of the same conductivity type as the impurity regions 105 may be injected into upper portions of the semiconductor patterns 132, thereby forming drain regions D. Alternatively, the drain regions D may be formed prior to formation of the trenches 140 described with reference to FIG. 9.

Subsequently, bit lines BL may be formed on the substrate including the drain regions D. The bit lines BL may be electrically connected to the drain regions D. The bit lines BL may be formed to cross over the gate electrodes WL as illustrated in FIG. 10. The bit lines BL may be electrically connected to the drain regions D through contact plugs.

Figure 11:
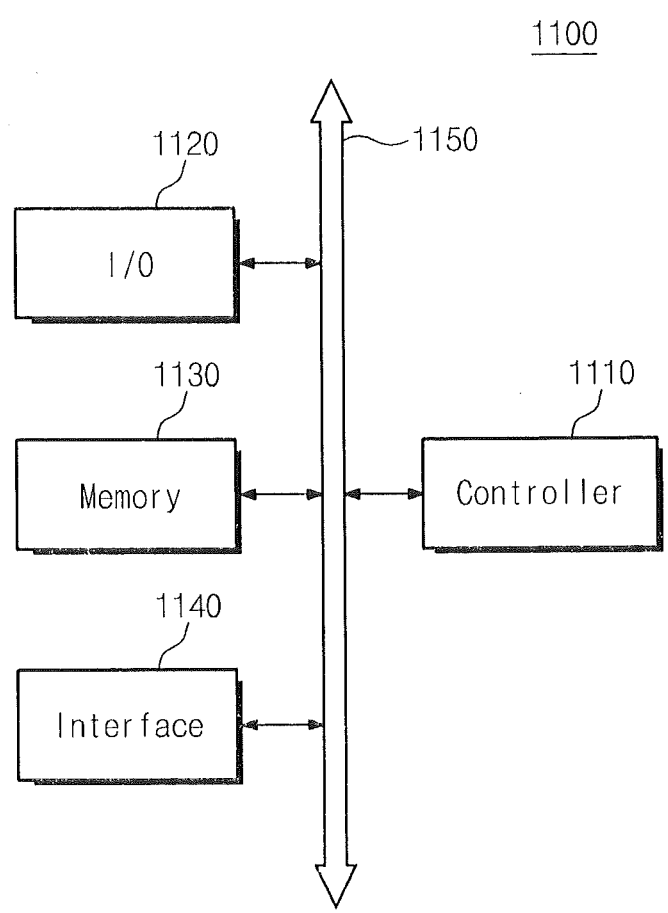
FIG. 11 is a schematic block diagram illustrating an example of electronic systems including semiconductor devices formed using etching compositions according to some exemplary embodiments.

FIG. 11 is a schematic block diagram illustrating an example of electronic systems including semiconductor devices formed using etching compositions according to some exemplary embodiments.

Referring to FIG. 11, an electronic system 1100 may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. That is, the data bus 1150 may correspond to a path through which electrical signals are transmitted.

The controller 1110 may include at least one microprocessor, a digital signal processor (DSP), a microcontroller or the like. The memory device 1130 may store commands executed by the controller 1110. The I/O unit 1120 may receive data or signals from an external device or may transmit data or signals to the external device. The I/O unit 1120 may include a keypad, a keyboard or a display unit.

The memory device 1130 may include at least one of the semiconductor devices according to the exemplary embodiments described above. The memory device 1130 may further include other types of semiconductor memory devices which are different from the semiconductor devices described in the above embodiments. For example, the memory device 1130 may further include a magnetic memory device, a phase change memory device, a dynamic random access memory (DRAM) device and/or a static random access memory (SRAM) device. The interface unit 1140 may transmit electrical data to a communication network or may receive electrical data from the communication network. The interface unit 1140 may operate by cable or wireless. Although not shown in the drawings, the electronic system 1100 may further include a fast DRAM device and/or a fast SRAM device that acts as a cache memory for improving an operation of the controller 1110.

The electronic system 1100 may be applied to personal digital assistants (PDAs), portable computers, web tablets, wireless phones, mobile phones, digital music players or memory cards. The electronic system 1100 may also be applied to other electronic products that receive or transmit information data by wireless.

Figure 12:
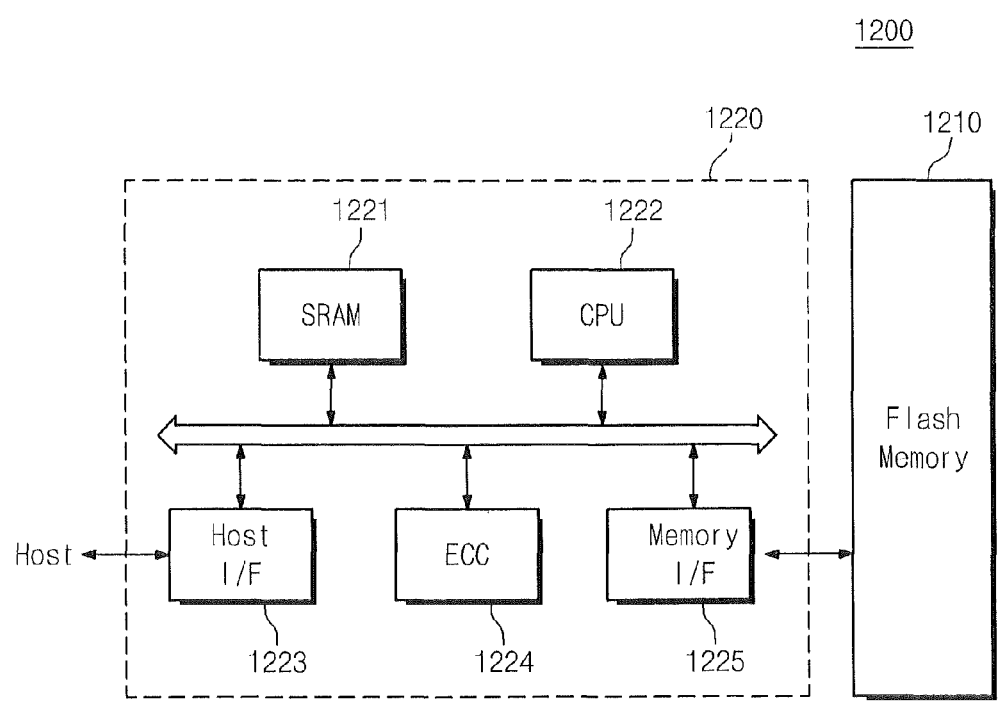
FIG. 12 is a schematic block diagram illustrating an example of memory cards including semiconductor devices formed using etching compositions according to some exemplary embodiments.

FIG. 12 is a schematic block diagram illustrating an example of memory cards including semiconductor devices formed using etching compositions according to some exemplary embodiments.

Referring to FIG. 12, a memory card 1200 may include a semiconductor memory device 1210 including at least one of the semiconductor devices according to the exemplary embodiments described above. The memory card 1200 may be used as a data storage media for storing a large capacity of data. That is, the semiconductor memory device 1210 may be fabricated using one of the etching compositions according to some exemplary embodiments. Further, the semiconductor memory device 1210 may further include another type of semiconductor memory device which is different from the semiconductor devices described in the above embodiments. For example, the semiconductor memory device 1210 may further include a dynamic random access memory (DRAM) device and/or a static random access memory (SRAM) device. The memory card 1200 may further include a memory controller 1220 that controls data communication between a host and the semiconductor memory device 1210.

The memory controller 1220 may include a static random access memory (SRAM) device 1221, a central processing unit (CPU) 1222, a host interface unit 1223, an error check and correction (ECC) block 1224 and a memory interface unit 1225. The SRAM device 1221 may be used as an operation memory of the CPU 1222. The host interface unit 1223 may be configured to include a data communication protocol between the memory card 1200 and the host. The ECC block 1224 may detect and correct errors of data which are read out from the flash memory device 1210. The memory interface unit 1225 may connect the memory controller 1220 to the memory device 1210. The central processing unit (CPU) 1222 may control overall operations for data communication of the memory controller 1220. Even though not shown in the drawings, the memory card 1200 may further include a read only memory (ROM) device that stores code data to interface with the host. The memory card 1200 may be used as a portable data storage card. Alternatively, the memory card 1200 may be configured to realize a solid state disk (SSD). In this case, hard disks in computer systems may be replaced with the memory card 1200.

The semiconductor devices fabricated using one of the etching compositions according to the exemplary embodiments described above may be encapsulated using various packaging techniques. For example, the semiconductor devices according to the aforementioned exemplary embodiments may be encapsulated using any one of a package on package (PoP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi chip package (MCP) technique, a wafer-level fabricated package (WFP) technique and a wafer-level processed stack package (WSP) technique.

According to the embodiments set forth above, an etching composition may include a silicon compound material, and the silicon compound material may include at least two bonds of silicon to oxygen. Thus, the etching composition may exhibit a high etch selectivity when a nitride layer is etched using the etching composition. Moreover, the silicon compound material may include atomic groups containing amino groups. Thus, the silicon compound material may have stable bonding structures. Consequently, the amino groups in the silicon compound material may suppress generation of particles during an etching process.

In addition, the etching composition may include ammonium ions, and the ammonium ions may combine with a byproduct generated during the etching process to convert the byproduct into a water-soluble compound. Thus, the ammonium ions in the etching composition may prevent the byproduct from being adsorbed on an oxide layer.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of forming a semiconductor device, the method comprising:

stacking nitride layers and oxide layers on a substrate to form a stack structure;
forming an opening in the stack structure;
forming a semiconductor pattern in the opening;
using a mask pattern to form a trench spaced apart from the semiconductor pattern to provide sidewalls exposing the nitride layers and oxide layers; and
removing the nitride layers,
wherein the nitride layers are removed using an etching process employing an etching composition comprising a phosphoric acid, ammonium ions or a compound comprising ammonium ions, and a silicon compound,
wherein the silicon compound comprises a silicon atom, an atomic group comprising an amino group combined with the silicon atom, and at least two oxygen atoms combined with the silicon atom.

2. The method of claim 1, wherein the etching composition comprises the silicon compound having a content in a range of about 0.01 wt % to about 15 wt % of the etching composition and the ammonium ions having a content in a range of about 0.01 wt % to about 10 wt % of the etching composition.

3. The method of claim 1, wherein the atomic group is an amino alkoxy group comprising 1 to 10 carbon atoms or an amino alkyl group comprising 1 to 10 carbon atoms.

4. The method of claim 1, wherein the silicon compound material is expressed by the following chemical Formula 1:

(Chemical Formula 1)

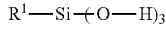

wherein, $R^1$ is an amino alkyl group or an amino alkoxy group.

5. The method of claim 1, wherein the silicon compound material is expressed by the following chemical Formula 2:

(Chemical Formula 2)

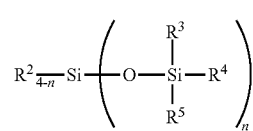

wherein, $R^2$, $R^3$, $R^4$ and $R^5$ are hydrogen, an alkyl group, an amino alkyl group or an amino alkoxy group, wherein at least one of $R^2$, $R^3$, $R^4$ and $R^5$ is an amino alkyl group or an amino alkoxy group, and wherein, n is 2 or 3.

6. The method of claim 1, wherein the compound comprising ammonium ions is selected from the group consisting of an ammonia gas, an ammonium chloride, an ammonium phosphate, an ammonium acetate, an ammonium sulfate, an ammonium formate and an ammonium complex compound.

7. The method of claim 1, wherein the oxygen atoms of the silicon compound combines with the oxide layers to protect the oxide layers during removal of the nitride layers.

8. The method of claim 1, wherein the opening is formed to expose the substrate.

* * * * *